United States Patent
Nagode et al.

(10) Patent No.: US 7,116,951 B2
(45) Date of Patent: Oct. 3, 2006

(54) TRANSMITTER CIRCUIT AND METHOD FOR MODULATION DISTORTION COMPENSATION

(75) Inventors: Thomas D. Nagode, Vernon Hills, IL (US); Peter Nanni, Algonquin, IL (US); Louis M. Nigra, Chicago, IL (US); Greg R. Black, Vernon Hills, IL (US); Keith Andrew Tilley, Round Rock, TX (US)

(73) Assignee: Motorola, Inc., Schaumberg, IL (US)

( * ) Notice: Subject to any disclaimer, the term of this patent is extended or adjusted under 35 U.S.C. 154(b) by 462 days.

(21) Appl. No.: 10/737,473

(22) Filed: Dec. 16, 2003

(65) Prior Publication Data

US 2005/0130609 A1     Jun. 16, 2005

(51) Int. Cl.
    H04B 1/04    (2006.01)
(52) U.S. Cl. .................. 455/126; 455/114.3; 455/127.1
(58) Field of Classification Search ................ 455/126, 455/522, 114.1, 114.3, 114.2, 73, 108, 113, 455/127.1, 127.2; 332/128, 149, 145; 375/300, 375/298
    See application file for complete search history.

(56) References Cited

U.S. PATENT DOCUMENTS

| 5,111,162 | A |   | 5/1992 | Hietala et al. |
| 5,420,536 | A | * | 5/1995 | Faulkner et al. ......... 455/127.2 |
| 5,430,416 | A |   | 7/1995 | Black et al. |
| 6,211,747 | B1 |  | 4/2001 | Trichet et al. |
| 6,366,177 | B1 | * | 4/2002 | McCune et al. ......... 455/114.3 |
| 2003/0215026 | A1 | * | 11/2003 | Hietala ........................ 375/297 |
| 2004/0063408 | A1 | * | 4/2004 | Leizerovich ................. 455/126 |
| 2004/0162039 | A1 | * | 8/2004 | Marque-Pucheu .......... 455/126 |

\* cited by examiner

*Primary Examiner*—Aung Moe
(74) *Attorney, Agent, or Firm*—Vedder, Price, Kaufman & Kammholz, P.C.

(57) ABSTRACT

A transmitter circuit (200, 400, 510) and method reduces amplitude modulation distortion in an amplifier (210). The transmitter circuit (200, 400, 510) includes a power control error data generator (230), a feedforward predistortion data generator (240), feedforward adder logic (250) and the amplifier (210). The power control error data generator (230) receives amplitude modulation data (252) and an RF coupled output signal (254) and, in response, produces power control error data (256). The feedforward predistortion data generator (240) receives the amplitude modulation data (252) and, in response, produces feedforward predistortion data (258). The feedforward adder logic (250) receives the power control error data (256) and the feedforward predistortion data (258) and, in response, produces power control data (260). The amplifier (210) receives the power control data (260) and an RF input signal (261) and, in response, produces an RF output signal (262), such that the power control data (260) reduces amplitude modulation distortion in the RF output signal (262).

22 Claims, 7 Drawing Sheets

TRANSMITTER CIRCUIT AND METHOD FOR MODULATION DISTORTION COMPENSATION

FIELD OF THE INVENTION

The present invention relates generally to a transmitter circuit and, more particularly, to a transmitter circuit to compensate for modulation distortion.

BACKGROUND OF THE INVENTION

Many wireless communication protocols provide for transmitters, operating within a communication network, which are capable of employing phase modulation (PM) techniques and (AM) amplitude modulation techniques. Examples of such wireless communication protocols include Enhanced Data Rates for Global Systems for Mobile Communications Evolution (EDGE), Global System for Mobile Communications (GSM), Code Division Multiple Access (CDMA) and Wideband Code Division Multiple Access (WCDMA). To accommodate the modulation requirement for each particular communication protocol, wireless devices such as wireless telephones, wireless personal data assistants (PDAs), pagers, two-way radios and other types of wireless devices employ a transmitter and modulation circuitry for providing the required amplitude and phase modulation.

Figure 1:
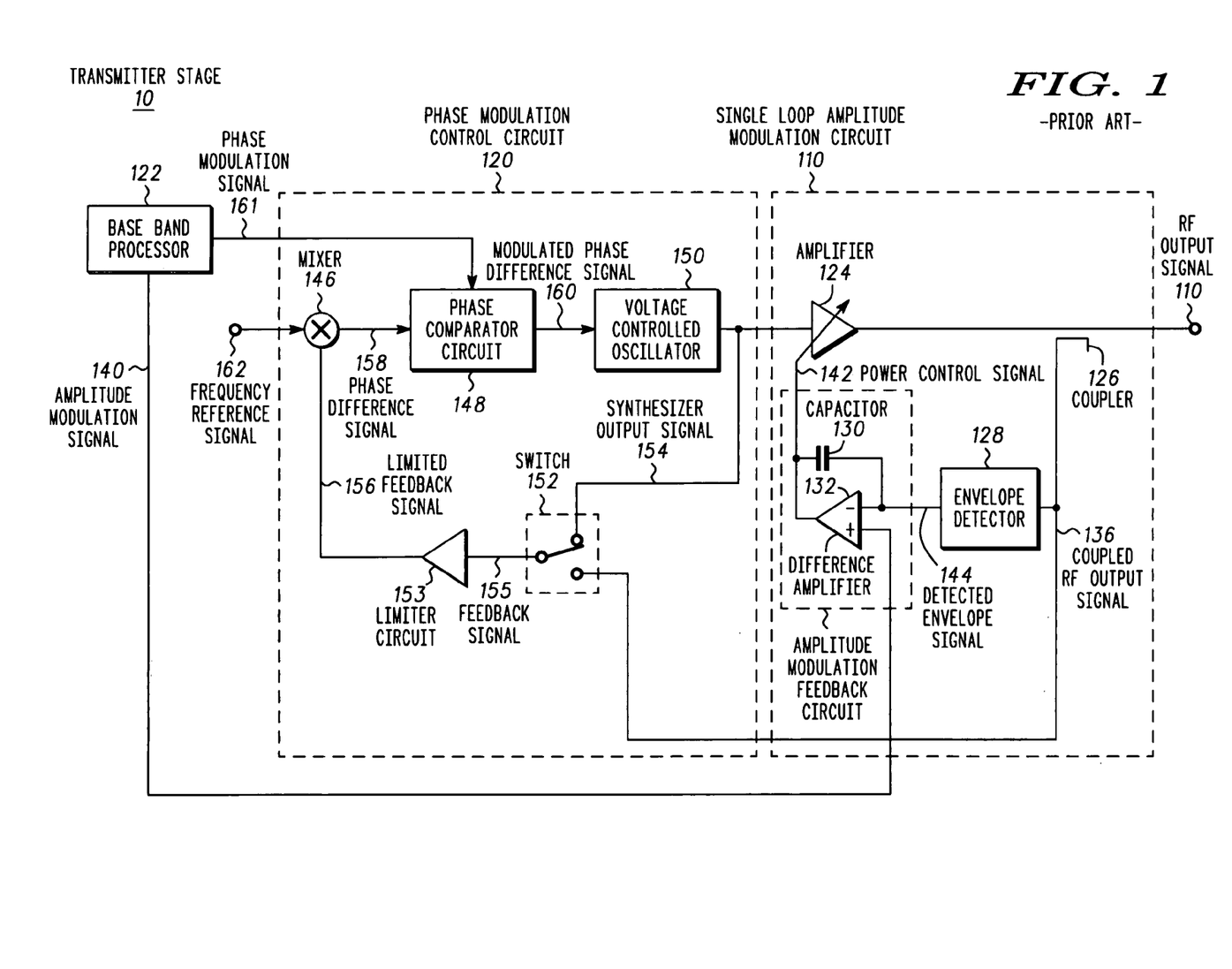
FIG. 1 is a prior art block diagram of a transmitter stage.

FIG. 1 is a block diagram of a transmitter stage 10 illustrating one previous technique, which employs a single loop amplitude modulation circuit 110, a phase modulation control circuit 120 and a base band processor 122. The single loop amplitude modulation circuit 110 includes an amplifier 124, an RF coupler 126 an envelope detector 128, and an amplitude modulation feedback circuit 129. The amplitude modulation feedback circuit 129 includes a capacitor 130 and a difference amplifier 132. A portion of the RF output signal 134 produced by the amplifier 124 is fed to the envelope detector 128 via the RF coupler 126 as an RF coupled output signal 136. The difference amplifier 132 generates a power control signal 142 based on the difference in voltage between the detected envelope signal 144 and an amplitude modulation signal 140 provided by the base band processor 122. The base band processor 122 may include a digital to analog converter to produce the amplitude modulation signal 140 for conversion from digital data to an analog signal. The difference amplifier 132 provides the power control signal 142 to the amplifier 124 such that the amplitude of the RF output signal 134 from the amplifier 124 is responsive to the power control signal 142, thereby achieving amplitude modulation of the RF output signal 134.

The phase modulation control circuit 120 consists of a mixer 146, a phase comparator circuit 148, a voltage controlled oscillator (VCO) 150, a switch 152, and a limiter circuit 153. The switch 152 selects from either a synthesizer output signal 154 produced by the VCO 150 or the RF coupled output signal 136 and provides a feedback signal 155 to the limiter circuit 153. Before the amplifier 124 is turned on, the switch 152 couples the synthesizer output signal 154 from the VCO 150 to the mixer 146 via the limiter circuit 153 as a limited feedback signal 156. After the amplifier 124 is turned on and the single loop amplitude modulation circuit 110 attains a locked condition, the switch 152 couples the detected RF output signal 136 to the mixer 146 via the limiter circuit 153. Accordingly, the switch 152 receives the detected RF output signal 136 and in response produces the feedback signal 155 such that the amplifier 124 becomes part of a phase locked loop formed by the phase modulation control circuit 120 and the single loop amplitude modulation circuit 110. As a result, the phase modulation control circuit 120 compensates for the phase distortion of amplifier 124.

The mixer 146 generates a phase difference signal 158 having an averaged energy level that is equal to the difference between the phase of the frequency reference signal 162 and the limited feedback signal 156. The phase comparator circuit 148 generates a modulated phase difference signal 160 based on the phase difference signal 158 and a phase modulation signal 161. The phase modulation signal 161 is provided by the base band processor 122. VCO 150 receives the modulated phase difference signal 160 and in response produces the synthesizer output signal 154. Since the limiter circuit 153 and the switch 152 have low phase distortion, the RF output signal 134 has a phase that is approximately equal to the phase of the frequency reference signal 162. When switch 152 is switched to receive the RF coupled output signal 136, then the phase modulation control circuit 120 thereby achieves phase modulation of the RF output signal 134.

A problem arises when the power control signal 142 provided to the amplifier 124 for controlling the amplitude of RF output signal 134 causes a phase shift on the RF output signal 134, referred to herein as an AM to PM conversion effect. A significant phase shift may occur, requiring burst-to-burst calibration due to the AM to PM conversion effect. This AM to PM conversion effect is a result of a nonlinearity of the amplifier 124 that is characteristic of power amplifiers that employ design techniques used to minimize bias current and maximize power efficiency and when the power of the RF output signal 134 is controlled by varying the amplifier 124 bias current. However, such techniques to enhance operating efficiencies may cause phase distortion in the RF output signal 134, resulting in significant errors in a receiver when attempting to receive the phase distorted RF output signal 134.

In the past, several approaches have been used in an attempt to eliminate this AM to PM conversion effect. According to one approach, by using a more linear amplifier 124, AM to PM effects were reduced. However, a highly linear amplifier 124 is inefficient and power-consuming and is not desirable for applications such as portable wireless devices.

According to another approach, the phase of the frequency reference signal 162 is adjusted such that the synthesizer output signal 154 is phase-predistorted, thereby canceling the phase distortion that occurs in the amplifier 124. However, the required degree of phase predistortion is dependent on the RF output signal 134 level, a supply voltage to the amplifier 124, and an operating temperature resulting in a very complex open loop control scheme. Additionally, the phase predistortion is further complicated when amplitude modulation is employed.

According to another method, the single loop amplitude modulation circuit 110 compensates for amplitude modulation distortion in the amplifier 124. The single loop amplitude modulation circuit 110, however, has a loop bandwidth that varies as a function of the power control signal 142. As a result, the single loop amplitude modulation circuit 110 may not sufficiently compensate for the amplitude modulation distortion within amplifier 124 resulting in an RF output signal 134 having excessive amplitude modulation distortion especially at high data rates.

BRIEF DESCRIPTION OF THE DRAWINGS

The present invention is illustrated by way of example and not limitation in the accompanying figures, in which like reference numerals indicate similar elements, and in which.

DETAILED DESCRIPTION OF THE PREFERRED EMBODIMENTS

A transmitter circuit and method reduces amplitude modulation distortion in an amplifier. The transmitter circuit includes a power control error data generator, a feedforward predistortion data generator, feedforward adder logic and an amplifier. The power control error data generator receives amplitude modulation data and an RF coupled output signal and in response produces power control error data. The feedforward predistortion data generator receives the amplitude modulation data and in response produces feedforward predistortion data. The feedforward adder logic receives the power control error data and the feedforward predistortion data and in response produces the power control data. The amplifier receives the power control data and an RF input signal and in response produces an RF output signal. The power control error data generator receives the RF coupled output signal such that the power control data reduces amplitude modulation distortion in the RF output signal.

Among other advantages, the transmitter circuit improves both phase modulation distortion compensation and amplitude modulation distortion compensation especially at high amplitude modulation data rates. The feedforward predistortion data generator produces the feedforward predistortion data in response to the amplitude modulation data faster than a stand alone phase distortion compensation feedback loop. For example, the feedforward predistortion data generator may be a lookup table including amplifier predistortion data corresponding to the amplitude modulation data.

The feedback loop formed by the power control error data generator, the feedforward adder logic and the amplifier in the transmitter circuit is only required to compensate for a very small change in amplitude modulation distortion, since the feedforward predistortion data generator is likely to predict the proper amount of amplitude modulation distortion. Additionally, the transmitter circuit also has a relatively constant loop bandwidth that allows for a high rate of transmission for the amplitude modulation data. As a result, compensation for the amplitude modulation distortion as a result of the use of the feedforward predistortion data generator improves the performance of amplitude modulation distortion compensation. Consequently, the transmitter circuit may accept even higher amplitude modulation data rates than previously available.

The transmitter circuit may fulfill a multimode role in order to overcome conflicting design requirements, such as reducing phase shifts and compensating for amplitude modulation distortion to provide both phase modulation and amplitude modulation in a high data rate application. As a result, a single transmitter circuit may be employed to provide both phase modulation and amplitude modulation for any required wireless communication protocol, such as EDGE, GSM, CDMA, WCDMA, or any current or future protocol, such as a third generation wireless communication protocol. The transmitter circuit, therefore, may employ both a phase modulation control circuit and an amplitude modulation feedforward and feedback circuit within the amplifier to compensate for phase shifts and amplitude modulation distortion.

Figure 2:
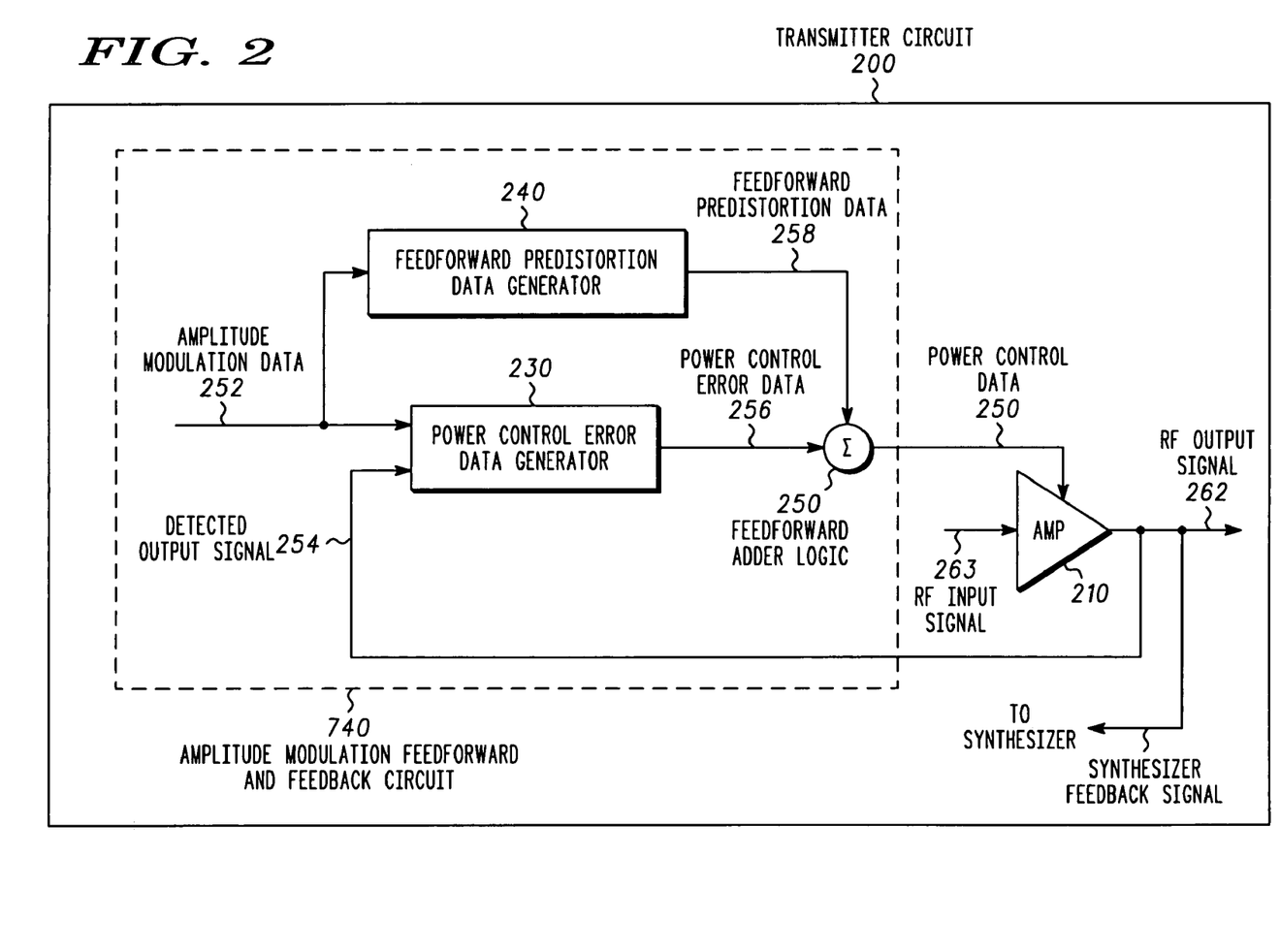
FIG. 2 is a block diagram of one example of a feedback transmitter circuit to reduce amplitude modulation distortion according to an exemplary embodiment of the invention.

FIG. 2 is a block diagram of a transmitter circuit 200 to reduce amplitude modulation distortion in an amplifier 210. The transmitter circuit 200 includes the amplifier 210, an amplitude modulation feedforward and feedback circuit 220 and an optional RF coupler. The amplitude modulation feedforward and feedback circuit 220 includes a power control error data generator 230, a feedforward predistortion data generator 240 and feedforward adder logic 250.

The power control error data generator 230 receives amplitude modulation data 252 and an RF coupled output signal 254, and in response produces power control error data 256. The feedforward predistortion data generator 240 receives the amplitude modulation data 252 and in response produces feedforward predistortion data 258.

According to one embodiment, the feedforward predistortion data generator 240 may be a microprocessor or any other suitable circuit for providing the feedforward predistortion data 258. For example, a digital signal processor (DSP), discrete logic or any other suitable combination of hardware, software and firmware may be used. The feedforward predistortion data generator 240 may further include at least one processing device and a storage element 410 coupled to the at least one processing device for containing executable instructions for execution by the processing circuitry. The storage element 410 may be any suitable memory element that stores digital data. This includes but is not limited to ROM, RAM, Distributed Memory or any other suitable elements. Additionally, the storage element 410 may be any suitable storage medium located locally or remotely, such as via server. Additionally, the storage element 410 may be accessible by a fixed or wireless network or any suitable network element via the Internet, a wide area network (WAN), a local area network (LAN), a wireless wide access network (WWAN), a wireless local area network (WLAN) and IEEE 802.11 wireless network, a Bluetooth network or any suitable communication interface or network.

The amplitude modulation data 252, for example, may be a symbol representing base band data as is known in the art. The base band data may be mapped into one of the set of symbols as part of the process of amplitude modulating the base band signal. The amplitude modulation feedforward and feedback circuit 220 may receive the amplitude modulation data 252 and the RF coupled output signal 254 and may amplitude modulate the amplitude modulation data 252 by varying the amplitude of the RF output signal 262.

The feedforward adder logic 250 is coupled to both the feedforward predistortion data generator 240 and the power control error data generator 230 through appropriate links. The feedforward adder logic 250 receives the power control error data 256 and the feedforward predistortion data 258 and in response produces power control data 260. The amplifier 210 is coupled to the feedforward adder logic 250 to receive the power control data 260. The amplifier 210 receives an RF input signal 261 and the power control data 260 and in response produces an RF output signal 262. The RF coupler 126, or any suitable device, may receive the RF output signal 262 and in response produce the RF coupled output signal 254, as is known in the art. The power control data 260 reduces amplitude modulation distortion in the amplifier 210.

Figure 3:
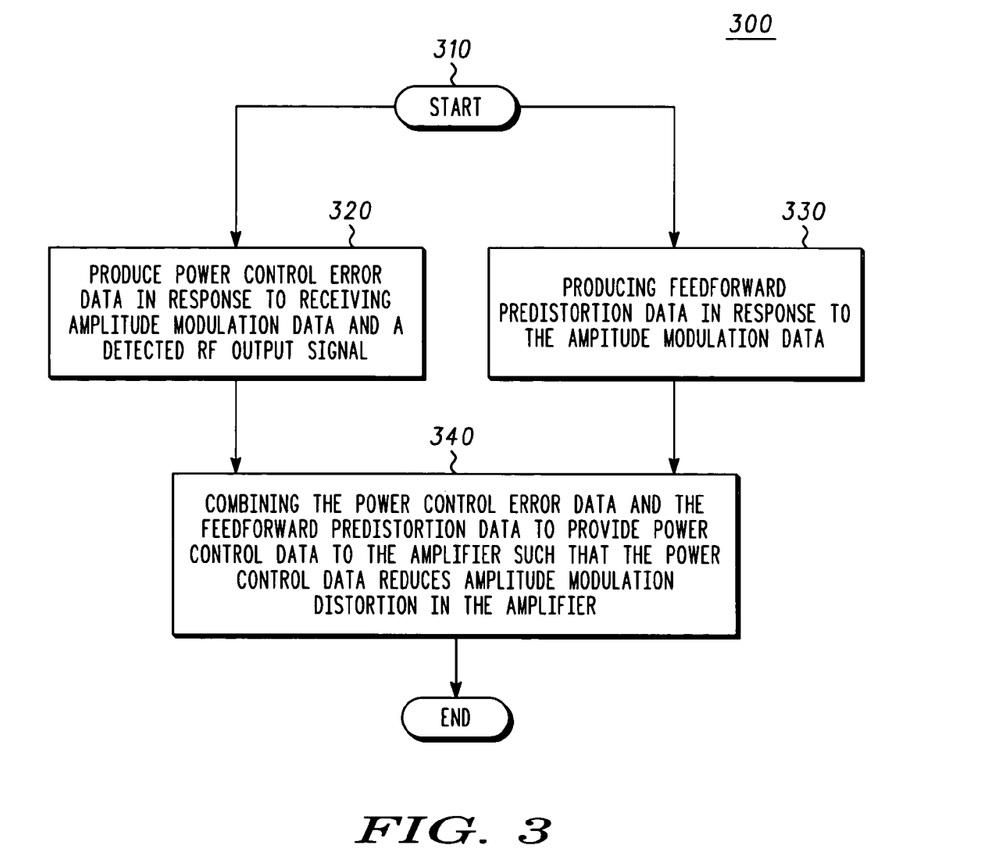
FIG. 3 is a flow chart of one example of an amplification method according to one embodiment of the invention.

FIG. 3 illustrates a method 300 for reducing amplitude modulation distortion in the amplifier 210 according to one embodiment of the invention. The method 300 may be carried out by the transmitter circuit 200 with respect to FIG. 2. However, any other suitable structure may also be used. It will be recognized that the method 300 beginning with step 310 will be described as a series of operations, but the operations may be performed in any suitable order and may be repeated in any suitable combination.

As shown in step 320, the power control error data generator 230 produces the power control error data 256 in response to receiving the amplitude modulation data 252 and the RF coupled output signal 254. As shown in step 330, the feedforward predistortion data generator 240 produces feedforward predistortion data 258 in response to the amplitude modulation data 252.

As shown in step 340, the feedforward adder logic 250 combines the power control error data 256 and the feedforward predistortion data 258 to provide the power control data 260 to the amplifier 210 such that the power control data 260 reduces amplitude modulation distortion in the amplifier 210. According to one embodiment, the power control data effectively controls a bias of the amplifier 210. However, the amplitude of the RF output signal 262 may be adjusted in any suitable manner.

Figure 4:
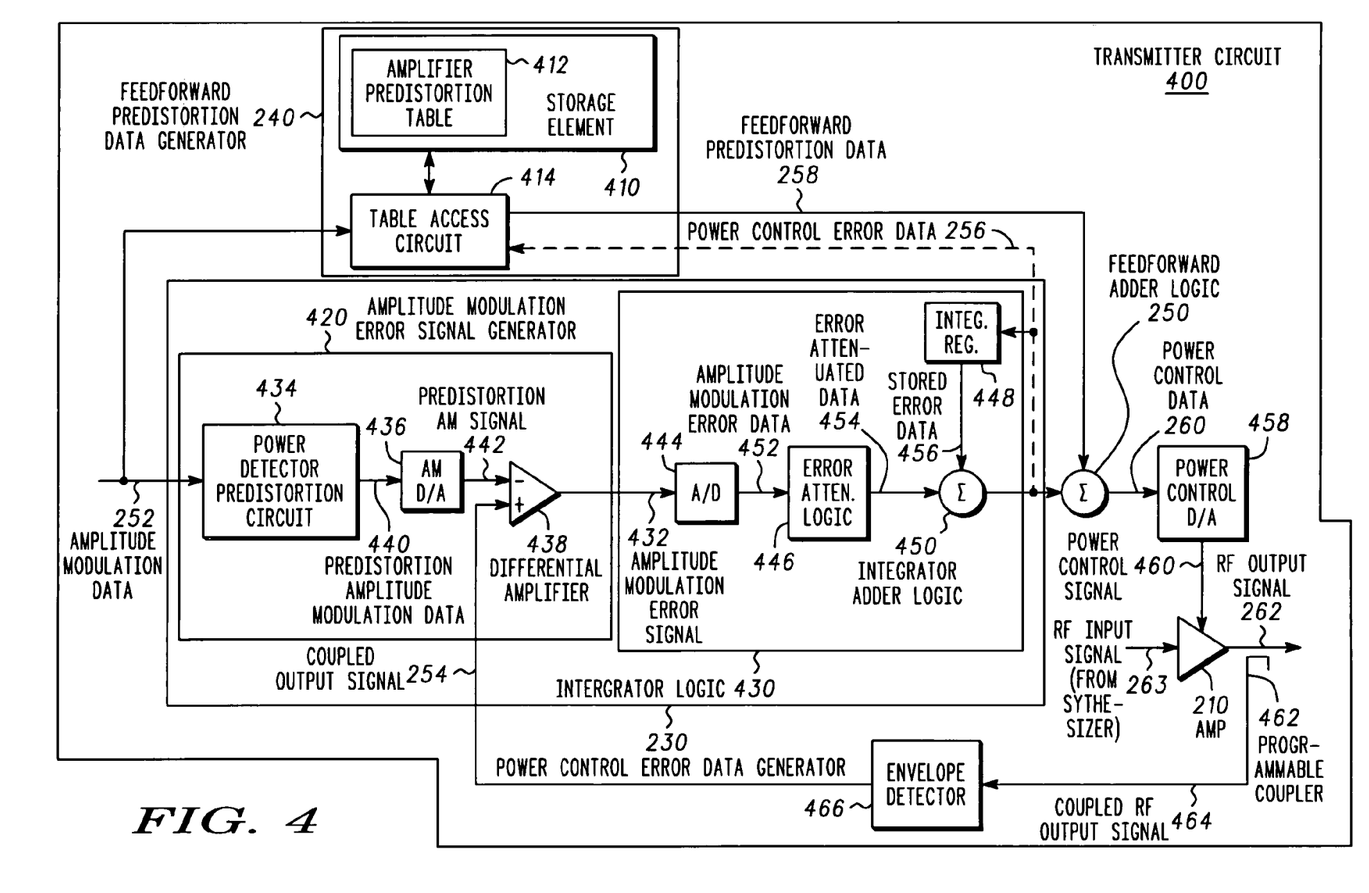
FIG. 4 is a block diagram of another example of a transmitter circuit according to another embodiment of the invention.

FIG. 4 is a block diagram of another example of a transmitter circuit 400 according to another embodiment of the invention. The transmitter circuit 400 further includes a power control digital-to-analog converter 458, a programmable coupler 462 and an optional envelope detector 466. The feedforward predistortion data generator 240 includes a storage element 410, an amplifier predistortion table 412 and a table access circuit 414. The feedforward predistortion data generator 240 includes a storage element 410 including data representing an amplifier predistortion table 412 containing at least the feedforward predistortion data 258 corresponding to the amplitude modulation data 252. The table access circuit 414 is coupled to the storage element 410, and provides the feedforward predistortion data 258 to the feedforward adder logic 250 in response to the amplitude modulation data 252. According to one embodiment, the feedforward predistortion data generator 240 produces the feedforward predistortion data 258 at a predetermined time delay with respect to receiving the amplitude modulation data 252. For example, the table access circuit 414 may delay access to the amplifier predistortion table 412. As a result, the time delay may allow for relative time alignment between the feedforward predistortion data 258 and the amplitude modulation data 252. Accordingly, adjusting the time delay for the generation of the feeforward predistortion data 258 may compensate for a time delay difference through the feedforward path through the feedforward predistortion data generator 240 and the integral path through the power control error data generator 230. Similarly, a time delay may be implemented in the power control error data generator 230 in order to achieve the relative time alignment required.

According to one embodiment, the feedforward predistortion data 258 correspond to a predicted amplitude modulation change in the amplifier 210 in response to the amplitude modulation data 252 such that the power control data 260 changes dynamically to reduce the amplitude modulation distortion in the amplifier 210. Accordingly, the table access circuit 414 dynamically varies the feedforward predistortion data 258 based on the predicted amplitude modulation change in the amplifier 210 due to the amplitude modulation data 252. For example, the table access circuit 414 may access the amplifier predistortion table 412 to obtain predetermined amplifier amplitude distortion data for every known type of amplitude modulation data 252.

The power control error data generator 230 further includes an amplitude modulation error signal generator 420 and integrator logic 430. The amplitude modulation error signal generator 420 receives the amplitude modulation data 252 and the RF coupled output signal 254 and in response produces an amplitude modulation error signal 432. Integrator logic 430 is coupled to the amplitude modulation error signal generator 420 and the feedforward adder logic 250. The integrator logic 430 receives the amplitude modulation error signal 432 and in response produces the power control error data 256.

The amplitude modulation error signal generator 420 includes a power detector predistortion circuit 434, a digital-to-analog converter 436 and a differential amplifier 438. The power detector predistortion circuit 434 receives the amplitude modulation data 252 and in response produces predistortion amplitude modulation data 440. The digital-to-analog converter 436 is coupled to the power detector predistortion circuit 434 to receive the predistortion amplitude modulation data 440 and in response produce a predistortion amplitude modulated signal 442. The differential amplifier 438 is coupled to the analog-to-digital converter 436, the envelope detector 466 and the integrator logic 430 and receives the predistortion amplitude modulation signal 442 and the RF coupled output signal 254 and in response produces the amplitude modulation error signal 432.

The integrator logic 430 includes an analog-to-digital converter 444, error attenuator logic 446, an integrator register 448 and integrator adder logic 450. The analog-to-digital converter 444 is coupled to the differential amplifier 438 and produces amplitude modulation error data 452 in response to the amplitude modulated error signal 432. The error attenuator logic 446 is coupled to the analog-to-digital converter 444 and produces error attenuated data 454 in response to the amplitude modulation error data 452. The integrator register 448 receives the power control error data 256 and in response produces stored error data 456. The integrator adder logic 450 is coupled to the error attenuator logic 446 and the integrator register 448 and receives the error attenuated data 454 and the stored error data 456 to produce the power control error data 256.

According to one embodiment, a power control digital-to-analog converter 458 is coupled to the feedforward adder logic 250 to receive the power control data 260 and in response to provide a power control signal 460 to amplifier 210. Accordingly, the power control digital-to-analog converter 458 may be integrated into amplifier 210 or may be external to amplifier 210 as shown in FIG. 4.

The programmable coupler 462 is coupled to the amplifier 210 to receive the RF output signal 262 and in response to produce the RF coupled output signal 254. The optional envelope detector 466 may be coupled to the programmable coupler 462 to receive the detected RF output signal 464 and in response to provide the RF coupled output signal 254 to the differential amplifier 438 as an envelope detected signal.

The power detector predistortion circuit 434 may include a storage element including data representing RF coupler predistortion data containing at least the predistortion amplitude modulation data 440 corresponding to the amplitude modulation data 252. The power detector predistortion circuit 434 may also include a table access circuit coupled to the storage element to produce the predistortion amplitude modulation data 440 in response to the amplitude modulation data 252. As a result, the power detector predistortion circuit 434 may dynamically vary the predistortion amplitude modulation data 440 based on a predicted amplitude modulation change in the programmable coupler 462 in response to the amplitude modulation data 252.

Alternatively, the power detector predistortion circuit 434 may be a digital signal processor, a microprocessor or any other suitable circuit for providing the RF coupler predistortion compensation. For example, the power detector predistortion circuit 434 may be a digital signal processor, a microprocessor, discrete logic or any suitable combination of hardware, software and firmware. According to one embodiment, the power detector predistortion circuit 434 is a microprocessor and may further include a storage element coupled to the microprocessor for storing one or more sets of instructions for execution by the processing circuitry. The instructions for example, may be based on using a curve fitting algorithm to provide the appropriate predistortion amplitude modulation data 440 in response to the amplitude modulation data 252.

Figure 5:
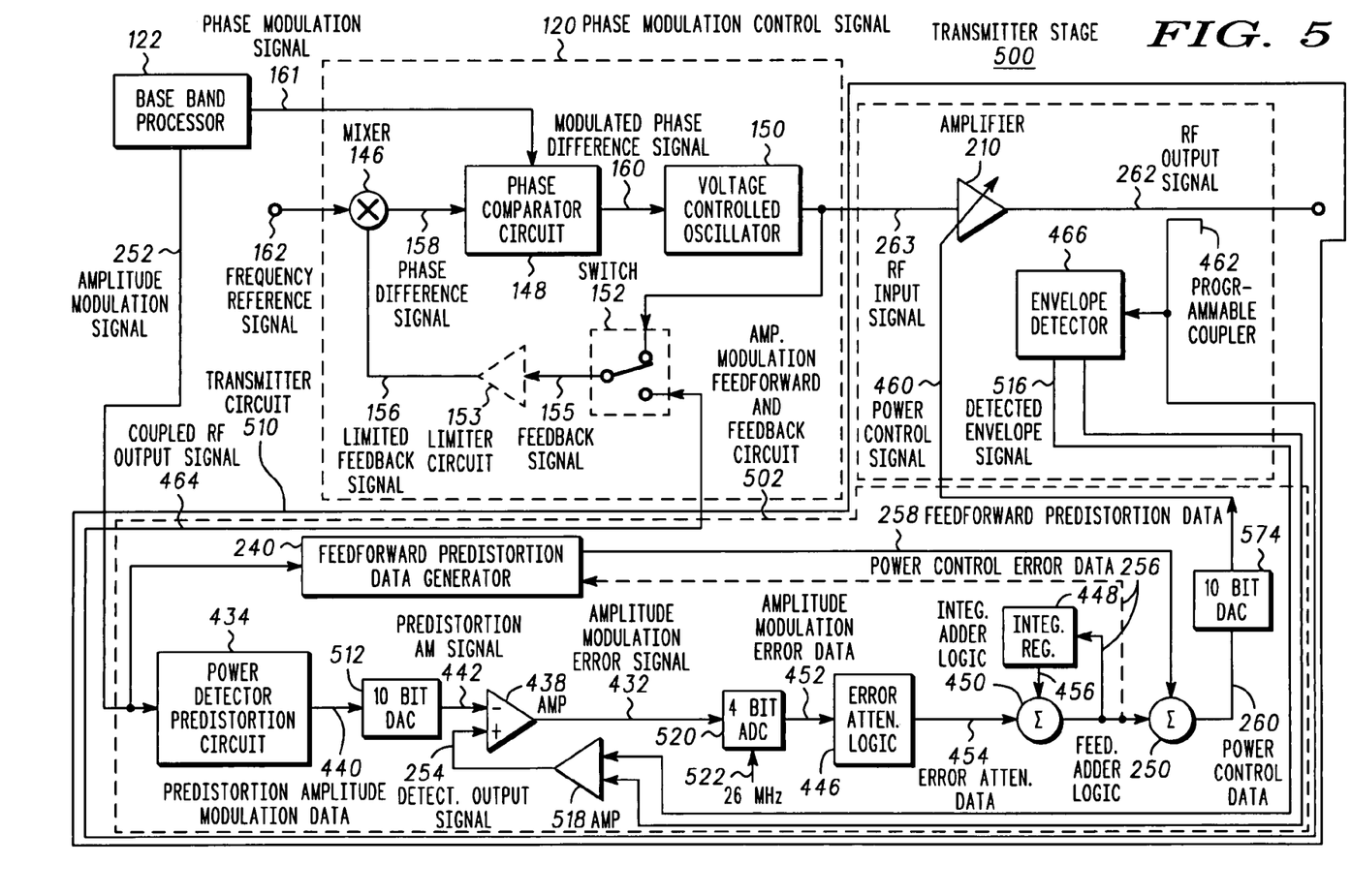
FIG. 5 is a block diagram of an example of a transmitter stage according to one embodiment of the invention.

FIG. 5 is a block diagram of an example of a transmitter stage 500 according to one embodiment of the invention. The transmitter stage 500 includes a transmitter circuit 510, the phase modulation control circuit 120, and the base band processor 122. The phase modulation control circuit 120 and the base band processor 122 were previously described with respect to FIG. 1. Transmitter circuit 510 includes the amplitude modulation feedforward and feedback circuit 502 and amplifier stage 504.

The phase modulation signal 161 produced by the base band processor 122, for example, may be based on a symbol representing base band data as is known in the art. For example, the phase modulation signal 161 may be phase shift keyed (PSK) modulated data. The phase comparator 148 may receive the phase modulation signal 161 as an analog signal to phase-shift the phase difference signal 158. Alternatively, the phase modulation signal 161 may be in a digital format and may subsequently digitally phase-shift the phase difference signal 158 by rotating the phase difference signal 158 on the phase constellation map by a compensation phase-shift in response to receiving the phase modulation signal 161.

The base band processor 122 may be a microprocessor or any other suitable circuit for providing the phase modulation signal 161 and the amplitude modulation data 252. For example, the base band processor 122 may be a digital signal processor (DSP), discrete logic or any other suitable combination of hardware, software and firmware. The base band processor 122 may further include at least one processing device and memory coupled to the at least one processing device for containing executable instructions for execution by the at least one processing device.

According to one embodiment, the predistortion amplitude modulation data 440 may be represented by 10-bit digital data. A 10-bit digital-to-analog converter 512 receives the 10-bit predistortion amplitude modulation data 440 and in response generates the predistortion AM signal 442. The differential amplifier 438 receives the predistortion amplitude modulated signal 442 on the non-inverting input of the differential amplifier 438 and the RF coupled output signal 254 on the inverting input of the differential amplifier 438, and in response produces the amplitude modulation error signal 432. According to one embodiment, the differential amplifier 438 is programmable, as is well known in the art.

The envelope detector 466 receives the detected RF output signal 462 and, in response, produces a detected envelope signal 516. According to one embodiment, the detected envelope signal 516 is a differential signal as is known in the art. According to this embodiment, a differential envelope amplifier 518 coupled to the envelope detector 466 receives the detected envelope signal 516 and, in response, produces the RF coupled output signal 254. According to one embodiment, the differential envelope amplifier 518 is programmable, as is well known in the art.

A four-bit analog-to-digital converter 520 receives the amplitude modulation error signal 432 and a 26 megahertz clock reference signal 522 and, in response, produces the amplitude modulation error data 452. The amplitude modulation error data 452 may have a positive or negative value. The error attenuation logic 446 receives the amplitude modulation error data 452 and, in response, produces the error attenuated data 454. According to one embodiment, the error attenuated data has a resolution of 22 bits and may be positive or negative. According to one embodiment, the error attenuation logic 446 is capable of digitally amplifying or attenuating the amplitude modulation error data 452, as is known in the art. For example, the error attenuation logic 446 may shift the amplitude modulation error data 452 in order to multiply it or divide by two.

The integration register 448 may be a storage device to store the power control error data 256 and, in response, produces the stored error data 456. According to one embodiment, the integration register 448 has 22 bit accuracy. The integrator adder logic 450 receives the error attenuated data 454 and the stored error data 456 and in response produces the power control error data 256. According to one embodiment, the power control error data 256 has 10 bit accuracy where the 10 most significant bits received by the integrator adder logic 450 is used.

According to one embodiment, the power control digital to analog converter 458 is a 10-bit digital-to-analog converter 524. As a result, the 10-bit digital-to-analog converter 524 receives, as a 10-bit word, the power control data 260 and, in response, produces the power control signal 460. According to one embodiment, the 10-bit digital-to-analog converter 524 may operate at approximately 2.6 megahertz. However, since the four-bit analog-to-digital converter 520 operates at 26 megahertz, the loop band width of the phase locked loop formed by the transmitter circuit 510 is 26 megahertz. According to this embodiment, the amplitude modulation data 252 is a 10-bit digital word which is clocked at a rate of 26 megahertz.

Figure 6:
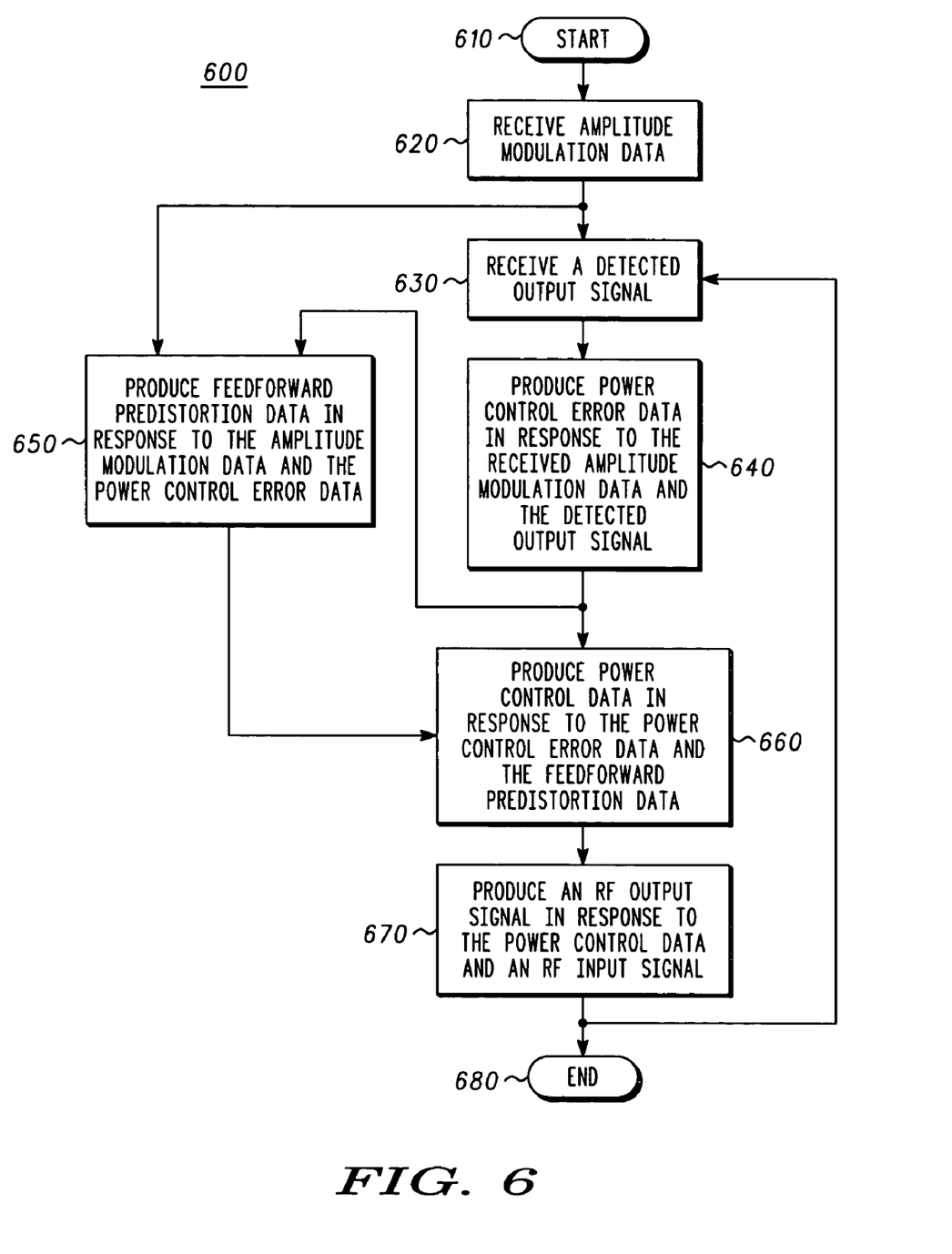
FIG. 6 is a flow chart of another example of an amplification method to reduce amplitude modulation distortion according to another embodiment of the invention.

FIG. 6 illustrates a method 600 for reducing amplitude modulation distortion in amplifier 210. The method 600 may be carried out by the transmitter circuit 200, of FIG. 2, the transmitter circuit 400 of FIG. 4 or the transmitter circuit 510 of FIG. 5. However, any other suitable structure may also be used. It will be recognized that the method 600, beginning with step 610, will be described as a series of operations, but the operations may be performed in any suitable order and may be repeated in a suitable combination. As shown in step 620, the power control error data generator 230 receives the amplitude modulation data 252.

As shown in step 630, the power control error data generator 230 receives the RF coupled output signal 254. As shown in step 640, the power control error data generator produces power control error data 256 in response to the received amplitude modulation data 252 and the RF coupled output signal 254.

As shown in step 650, the feedforward predistortion data generator 240 produces the feedforward amplifier predistortion data 258 as previously described in response to the amplitude modulation data 252. As shown in step 660, the feedforward adder logic 250 produces the power control data 260 in response to the power control error data 256 and the feedforward predistortion data 258. As shown in step 670, the amplifier 210 produces the RF output signal 262 in response to the power control data 260 and the RF input signal 262.

Figure 7:
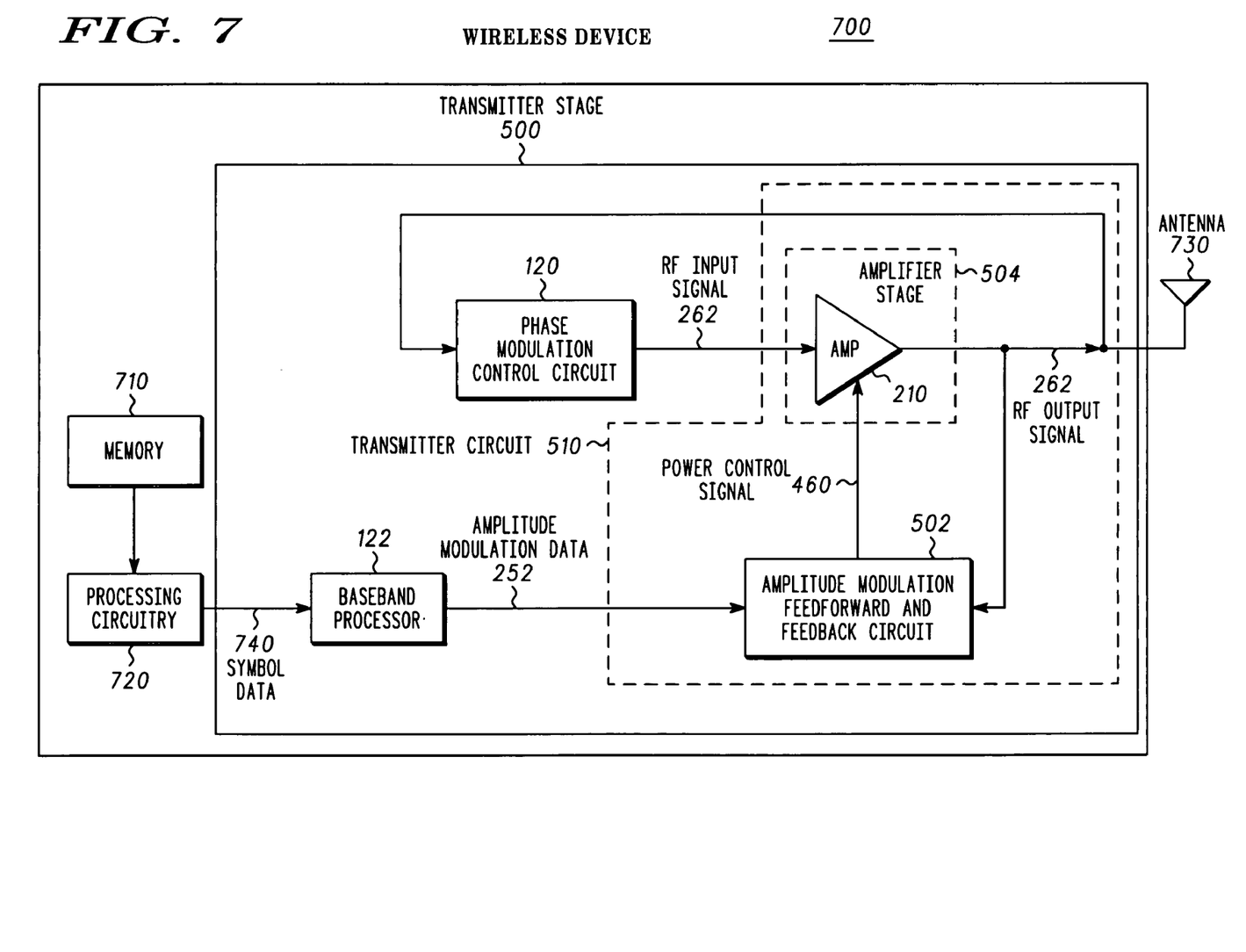
FIG. 7 is a block diagram of a wireless device according to one embodiment of the invention.

FIG. 7 is a block diagram of a wireless device 700 according to one embodiment of the invention. The wireless device 700 includes memory 710, processing circuitry 720, a base band processor 122, a transmitter stage 500 and an antenna 730. Antenna 730 is coupled to the amplifier 210 and receives the RF output signal 262 and, in response, transmits the RF output signal 262.

Processing circuitry 720 controls the base band processor 122 and the transmitter stage 500. The processing circuitry 720 includes one or more processors, such as a microprocessor, a digital signal processor, a microcomputer or any other suitable processing device. In addition, processing circuitry 720, as used herein, may include discrete logic, stage machines or any other suitable combination of hardware, software and/or firmware. Processing circuitry 720 may provide symbol data 740 and other control data as necessary to allow base band processor 122 to produce the amplitude modulation data 252, as previously described. The processing circuitry 720 may also control the wireless device 700 and the transmitter stage 500, as is necessary. Processing circuitry 720 is also coupled to memory 710 and contains executable instructions that, when executed, cause the processing circuitry 720 to carry out the operations described herein.

Among other advantages, the transmitter circuit 500 improves both phase modulation distortion compensation and amplitude modulation distortion compensation especially at high amplitude modulation data rates. The feedforward predistortion data generator 240 produces the feedforward predistortion data 258 in response to the amplitude modulation data 252 faster than a stand alone phase distortion compensation feedback loop.

The feedback loop formed by the power control error data generator 230, the feedforward adder logic 250 and the amplifier 210 is only required to compensate for a very small change in amplitude modulation distortion, since the feedforward predistortion data generator 240 is likely to predict the proper amount of amplitude modulation distortion. As a result, the loop formed by the power control error data generator 230, the feedforward adder logic 250 and the amplifier 210 need only correct for any error between the feedforward predistortion data 258 and the amplitude modulation data 252 due to what is likely to be a very small residual error in amplitude modulation distortion for the amplifier 210. The transmitter circuit 200 also has a relatively constant loop bandwidth that allows for a high data rate for the amplitude modulation data 252. As a result, compensation for the amplitude modulation distortion as a result of the use of the feedforward predistortion data generator 240 improves the performance of amplitude modulation distortion compensation. Consequently, the transmitter circuit 200 may accept even higher amplitude modulation data rates than a stand alone phase distortion compensation feedback loop.

The transmitter circuit 200 may fulfill a multimode role in order to overcome conflicting design requirements, such as reducing phase shifts and compensating for amplitude modulation distortion to provide both phase modulation and amplitude modulation in a high data rate application. As a result, a single transmitter circuit may be employed to provide both phase modulation and amplitude modulation for any required wireless communication protocol, such as EDGE, GSM, CDMA, WCDMA, or any current or future protocol, such as a third generation wireless communication protocol. The transmitter circuit 200, therefore, may employ both the phase modulation control circuit 120 and the amplitude modulation feed forward and feedback circuit 502 to compensate for phase shifts and amplitude modulation distortion.

It is understood that the implementation of other variations and modifications of the invention and its various aspects will be apparent to those of ordinary skill in the art and that the invention is not limited by the specific embodiments described. It is therefore contemplated to cover by the present invention any and all modifications, variations or equivalents that fall within the spirit and scope of the basic underlying principles disclosed and claimed herein.

What is claimed is:

1. A transmitter circuit comprising:
    a power control error data generator operative to receive amplitude modulation data and a RF coupled output signal and in response to produce power control error data;
    a feedforward predistortion data generator, operative to receive the amplitude modulation data and in response to produce feedforward predistortion data;
    feedforward adder logic, operatively coupled to the power control error data generator and to the feedforward predistortion data generator, and operative to receive the power control error data and the feedforward predistortion data and, in response, to produce power control data; and
    an amplifier, operatively coupled to the feedforward adder logic, and operative to receive the power control data and a radio frequency (RF) input signal and in response to produce an RF output signal, wherein the RF coupled output signal is associated with the RF output signal and wherein the power control data reduces amplitude modulation distortion in the RF output signal.

2. The transmitter circuit of claim 1 wherein the feedforward predistortion data generator includes:
    a storage element, including data representing an amplifier predistortion table containing at least the feedforward predistortion data corresponding to the received amplitude modulation data; and
    a table access circuit, operatively coupled to the storage element, and the feedforward adder logic and operative to produce the feedforward predistortion data in response to the amplitude modulation data.

3. The transmitter circuit of claim 2 wherein the table access circuit dynamically varies the feedforward predistortion data based on a predicted amplitude modulation change in the amplifier in response to the amplitude modulation data.

4. The transmitter circuit of claim 1, wherein the power control data adjusts a bias of the amplifier.

5. The transmitter circuit of claim 1, wherein the feedforward predistortion data corresponds to a predicted amplitude modulation change in the amplifier in response to the amplitude modulation data, such that the power control data changes dynamically to reduce the amplitude modulation distortion in the amplifier.

6. The transmitter circuit of claim 1, further including a phase modulation control circuit including:
   a switch, operatively coupled to the amplifier, and operative to receive the RF coupled output signal and the RF input signal and, in response, to produce a feedback signal;
   a mixer, operatively coupled to the switch, and operative to receive a frequency reference signal and the feedback signal and to produce a phase difference signal;
   a phase comparator, operatively coupled to the mixer, and operative to receive a phase modulation signal and the phase difference signal and in response to produce a modulated phase difference signal; and
   a voltage controlled oscillator, operatively coupled to the phase comparator, the amplifier, and the switch, and operative to receive the modulated phase difference signal and, in response, to provide the RF input signal to the amplifier and to the switch.

7. A transmitter circuit comprising:
   an amplitude modulation error signal generator operative to receive amplitude modulation data and a RF coupled output signal and in response to produce an amplitude modulation error signal;
   integrator logic, operatively coupled to the amplitude modulation error signal generator, and operative to receive the amplitude modulation error signal and in response to produce power control error data;
   a feedforward predistortion data generator, operative to receive the amplitude modulation data and in response to produce feedforward predistortion data; and
   feedforward adder logic, operatively coupled to the integrator logic, the feedforward predistortion data generator and to the amplifier, and operative to receive the power control error data and the feedforward predistortion data and in response to produce power control data,
   an amplifier operatively coupled to the feedforward adder logic, and operative to receive the power control data and in response to produce an RF output signal associated with the RF coupled output signal, such that the power control data is operative to reduce amplitude modulation distortion in the RF output signal.

8. The transmitter circuit of claim 7 wherein the feedforward predistortion data generator includes:
   a storage element, including data representing an amplifier predistortion table containing at least the feedforward amplifier predistortion data corresponding to the received amplitude modulation data; and
   a table access circuit operatively coupled to the storage element, and the feedforward adder logic and operative to produce the feedforward predistortion data in response to the amplitude modulation data.

9. The transmitter circuit of claim 8 wherein the table access circuit dynamically varies the feedforward predistortion data based on a predicted amplitude modulation change in the amplifier in response to the amplitude modulation data.

10. The transmitter circuit of claim 7 wherein the feedforward predistortion data corresponds to a predicted amplitude modulation change in the amplifier in response to the amplitude modulation data, such that the power control data changes dynamically to reduce the modulation distortion in the amplifier.

11. The transmitter circuit of claim 7 wherein the amplitude modulation error signal generator includes:
   a RF coupler predistortion circuit, operative to receive the amplitude modulation data and in response to produce predistortion amplitude modulation data;
   a digital-to-analog converter operatively coupled to the RF coupler predistortion circuit and operative to receive the predistortion amplitude modulation data and, in response, to produce a predistortion amplitude modulated signal; and
   a differential amplifier, operatively coupled to the analog-to-digital converter, the amplifier and to the integrator logic, and operative to receive the predistortion amplitude modulated signal and the RF coupled output signal and, in response, to produce the amplitude modulated error signal.

12. The transmitter circuit of claim 7 wherein the integrator logic includes:
   an analog-to-digital converter, operatively coupled to the amplitude modulation error signal generator, and operative to produce amplitude modulation error data in response to the amplitude modulated error signal;
   error attenuator logic, operatively coupled to the analog-to-digital converter, and operative to produce error attenuated data in response to the amplitude modulation error data;
   an integrator register operative to receive the power control error data and in response to produce stored error data; and
   integrator adder logic, operatively coupled to the error attenuator logic and the integrator register, and operative to receive the error attenuated data and the stored error data to produce the power control error data.

13. A transmitter circuit comprising:
   a digital-to-analog converter operative to receive amplitude modulation data and in response to produce a predistortion amplitude modulated signal;
   a differential amplifier, operatively coupled to the digital-to-analog converter, and operative receive the predistortion amplitude modulated signal and a detected RF output signal and in response to produce an amplitude modulated error signal;
   an analog-to-digital converter, operatively coupled to the differential amplifier, and operative to receive the amplitude modulated error signal, and in response to produce amplitude modulation error data;
   error attenuator logic, operatively coupled to the analog-to-digital converter, and operative to produce error attenuated data in response to the amplitude modulation error data;
   an integrator register operative to receive the power control error data and in response to produce stored error data;
   integrator adder logic, operatively coupled to the error attenuator logic and the integrator register, and operative to receive the error attenuated data and the stored error data and in response to produce the power control error data;
   a feedforward predistortion data generator, operative to receive the amplitude modulation data, and in response to produce feedforward predistortion data;
   feedforward adder logic, operatively coupled to the integrator logic, the feedforward predistortion data generator and to the amplifier, and operative to receive the power control error data and the feedforward predistortion data and in response to produce power control data; and an amplifier, operatively coupled to the feedforward adder logic, and operative to receive the power control data and an RF input signal, and in response to produce an RF output signal associated with the RF coupled output signal, such that the power control data is operative to reduce amplitude modulation distortion in the RF output signal.

14. The transmitter circuit of claim 13, further including a phase modulation control circuit including:
   a switch, operatively coupled to the amplifier, and operative to receive the detected RF output signal and the RF input signal and, in response, to produce a feedback signal;
   a mixer, operatively coupled to the switch, and operative to receive a frequency reference signal and the feedback signal and in response to produce a phase difference signal;
   a phase comparator, operatively coupled to the mixer, and operative to receive a phase modulation signal and the phase difference signal, and in response to produce a modulated phase difference signal; and
   a voltage controlled oscillator, operatively coupled to the phase comparator, the amplifier and to the switch, and operative to receive the modulated phase difference signal and, in response, to provide the RF input signal to the amplifier.

15. The transmitter circuit of claim 13 wherein the feedforward predistortion data generator includes:
   a storage element, including data representing an amplifier predistortion table containing at least the feedforward amplifier predistortion data corresponding to the received amplitude modulation data; and
   a table access circuit, operatively coupled to the storage element, and the feedforward adder logic and operative to produce the feedforward predistortion data in response to the amplitude modulation data.

16. The transmitter circuit of claim 15 wherein the table access circuit dynamically varies the feedforward predistortion data based on a predicted amplitude modulation change in the amplifier in response to the amplitude modulation data.

17. The transmitter circuit of claim 13, wherein the feedforward predistortion data corresponds to a predicted amplitude modulation change in the amplifier in response to the amplitude modulation data, such that the power control data changes dynamically to reduce the amplitude modulation distortion in the amplifier.

18. The transmitter circuit of claim 13 wherein the feedforward predistortion logic generator includes:
   at least one processing device;
   memory coupled to the processing circuitry containing executable instructions that causes one or more processing devices to:
   receive the amplitude modulation data; and
   generate the feedforward predistortion data.

19. A wireless device comprising:
   a transmitter circuit including:
   a power control error data generator operative to receive amplitude modulation data and a RF coupled output signal and, in response, to produce power control error data;
   a feedforward predistortion data generator, operative to receive the amplitude modulation data and in response to produce feedforward distortion data; and
   feedforward adder logic, operatively coupled to the power control error data generator and to the feedforward predistortion data generator, and operative to receive the power control error data and the feedforward predistortion data and in response to produce power control data;
   an amplifier operatively coupled to the feedforward adder logic, and operative to receive the power control data and an RF input signal and in response to produce an RF output signal, wherein the power control data reduces amplitude modulation distortion in the RF output signal;
   a base band processor, operatively coupled to the feedforward predistortion data generator, and to the power control error data generator and operative to produce the amplitude modulation data; and
   an antenna, operatively coupled to the amplifier, and operative to receive the RF output signal and in response to transmit the RF output signal.

20. The wireless device of claim 19 wherein the feedforward predistortion data generator includes:
   a storage element, including data representing an amplifier predistortion table containing at least the feedforward predistortion data corresponding to the received amplitude modulation data; and
   a table access circuit, operatively coupled to the storage element, and the feedforward adder logic and operative to produce the feedforward predistortion data in response to the amplitude modulation data.

21. A method to reduce amplitude modulation distortion in an amplifier comprising:
   producing power control error data in response to receiving amplitude modulation data and a detected RF output signal;
   producing feedforward predistortion data in response to the amplitude modulation data; and
   combining the power control error data and the feedforward predistortion data to provide power control data to the amplifier such that the power control data reduces the amplitude modulation distortion in the amplifier.

22. The method of claim 21 wherein the feedforward power distortion data corresponds to a predicted amplitude modulation change in the amplifier in response to the amplitude modulation data, and wherein the power control data changes dynamically to reduce the amplitude modulation distortion in the amplifier.

* * * * *